United States Patent [19]

Tihanyi

[11] Patent Number: 5,438,215
[45] Date of Patent: Aug. 1, 1995

[54] POWER MOSFET

[75] Inventor: Jenoe Tihanyi, München, Germany

[73] Assignee: Siemens Aktiengesellschaft, Munich, Germany

[21] Appl. No.: 218,372

[22] Filed: Mar. 25, 1994

[30] Foreign Application Priority Data

Mar. 25, 1993 [DE] Germany ............ 43 09 764.2

[51] Int. Cl.⁶ .................. H01L 29/78; H01L 29/784; H01L 29/94
[52] U.S. Cl. ..................... 257/401; 257/341; 257/342
[58] Field of Search ............ 257/401, 139, 133, 149, 257/147, 155, 341, 138, 342, 355, 135

[56] References Cited

U.S. PATENT DOCUMENTS 5,323,059  6/1994  Rutter et al. ............ 257/139

FOREIGN PATENT DOCUMENTS 0361589  4/1990  European Pat. Off. ............ 257/139
2852621  6/1981  Germany .

Primary Examiner—Robert P. Limanek
Assistant Examiner—Wael M. Fahmy
Attorney, Agent, or Firm—Herbert L. Lerner; Laurence A. Greenberg

[57] ABSTRACT

A power MOSFET includes a semiconductor body having first and second surfaces. An inner zone of a first conduction type has a given dopant concentration. At least one base zone of a second conduction type is adjacent the inner zone and the first surface. At least one source zone is embedded in the at least one base zone. At least one drain zone is adjacent one of the surfaces. Additional zones of the second conduction type are disposed in the inner zone inside a space charge zone developing when a blocking voltage is present. At least one additional zone of the first conduction type is disposed between the additional zones of the second conduction type and is doped higher than the inner zone. The additional zones have a dopant level and the additional zones of the second conduction type are mutually spaced apart, for depleting charge carriers when a blocking voltage is applied.

9 Claims, 3 Drawing Sheets

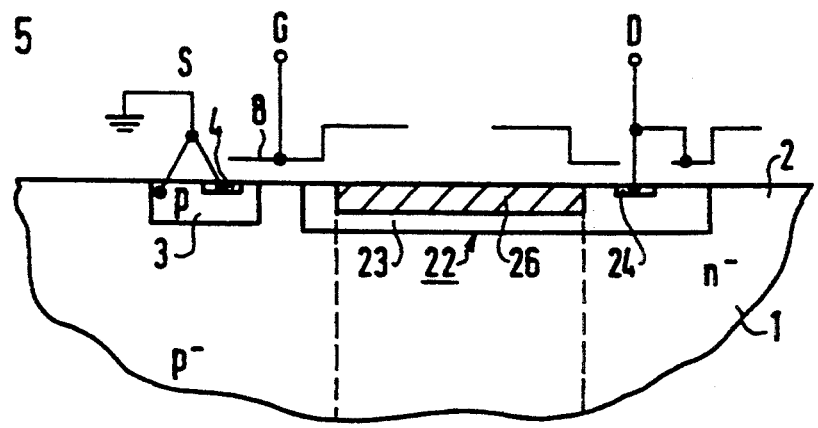
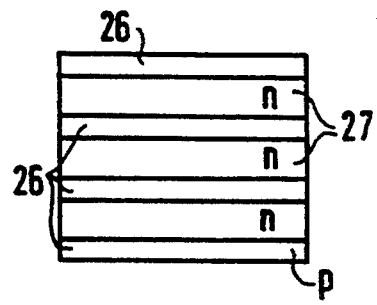
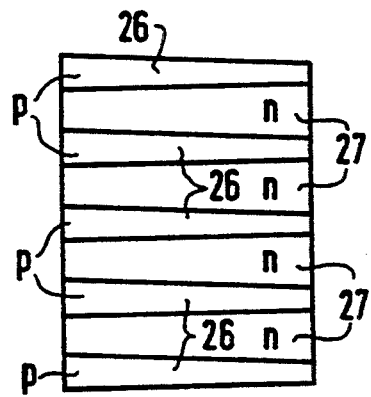

POWER MOSFET

BACKGROUND OF THE INVENTION

FIELD OF THE INVENTION

The invention relates to a power MOSFET with a semiconductor body having an inner zone of a first conduction type and a given dopant concentration, at least one base zone of a second conduction type being adjacent the inner zone and a first surface of the semiconductor body, at least one source zone being embedded in each base zone, and at least one drain zone adjacent one of the surfaces of the semiconductor body.

Such power MOSFETs have long been known. The unipolar conduction mechanism of those MOSFETs means that the conducting-state DC resistance depends essentially on the doping of the inner zone. In power MOSFETs of over 500 V blocking voltage, the conducting-state DC resistance becomes higher than in comparable bipolar transistors. Increasing the doping is not an option, because that would reduce the blocking capability.

SUMMARY OF THE INVENTION

It is accordingly an object of the invention to provide a power MOSFET, which overcomes the hereinafore-mentioned disadvantages of the heretofore-known devices of this general type and which is suitable for high blocking voltage but yet has a low track resistance in a conducting state.

With the foregoing and other objects in view there is provided, in accordance with the invention, a power MOSFET, comprising a semiconductor body having first and second surfaces; an inner zone of a first conduction type and a given dopant concentration; at least one base zone of a second conduction type being adjacent the inner zone and the first surface; at least one source zone being embedded in each of the at least one base zone; at least one drain zone adjacent one of the surfaces; additional zones of the second conduction type being disposed in the inner zone inside a space charge zone developing when a blocking voltage is present; and at least one additional zone of the first conduction type being disposed between the additional zones of the second conduction type and being doped higher than the inner zone; the additional zones having a dopant level and the additional zones of the second conduction type being mutually spaced apart, for depleting charge carriers when a blocking voltage is applied.

In accordance with another feature of the invention, the at least one base zone and the drain zone are spaced apart by a shortest connecting line, and the additional zones have a flat shape and are disposed parallel to the shortest connecting line.

In accordance with a further feature of the invention, the at least one base zone and the drain zone are spaced apart by a shortest connecting line, and the additional zones have a rod-like shape and are disposed parallel to the shortest connecting line.

In accordance with an added feature of the invention, the drain zone adjoins the second surface, and the additional zones are disposed perpendicular to the surface.

In accordance with an additional feature of the invention, the drain zone and the additional zones are adjacent the first surface and are disposed parallel to the surface.

In accordance with a concomitant feature of the invention, the additional zones of the second conductivity type are electrically connected to the at least one base zone.

Other features which are considered as characteristic for the invention are set forth in the appended claims.

Although the invention is illustrated and described herein as embodied in a power MOSFET, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a fragmentary, sectional view of a lateral MOSFET according to the invention; and FIGS. 6 and 7 are plan views of two exemplary embodiments of additional zones in the lateral MOSFET of FIG. 5.

DESCRIPTION OF THE PREFERRED EMBODIMENTS

Figure 1:
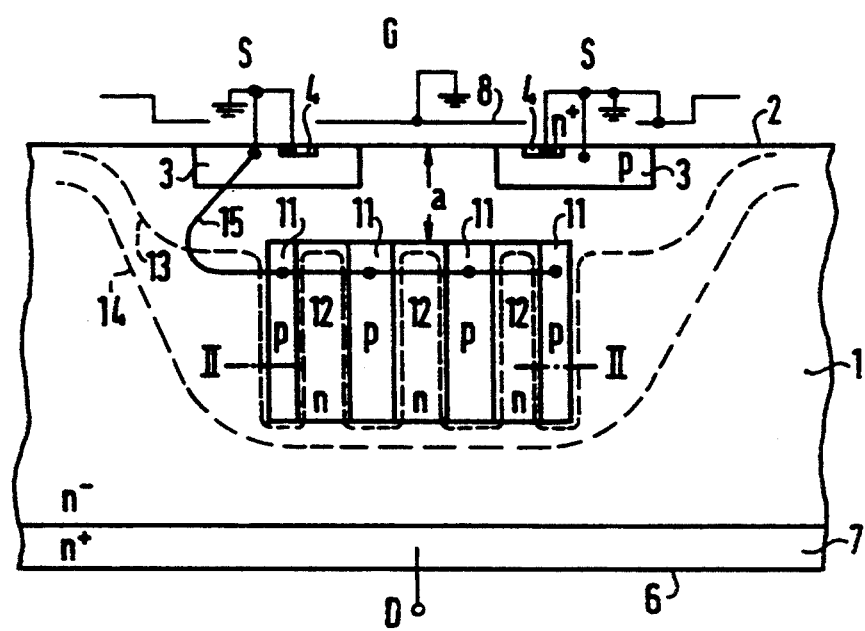
FIG. 1 is a fragmentary, diagrammatic, sectional view of a vertical MOSFET according to the invention.

Referring now to the figures of the drawing in detail and first, particularly, to FIG. 1 thereof, there is seen a vertical MOSFET which has an inner zone 1 with a low-n-doping of a first conduction type. Base zones 3 of an opposite or second (p) conduction type are formed in an upper surface 2 of the semiconductor body. Source zones 4 of the first conduction type (n+) are embedded in the base zones 3. A gate electrode 8 is disposed in insulated fashion above the surface 2. A highly doped drain zone 7 of the same conduction type as the inner zone 1 is provided on another surface 6.

Figure 2:
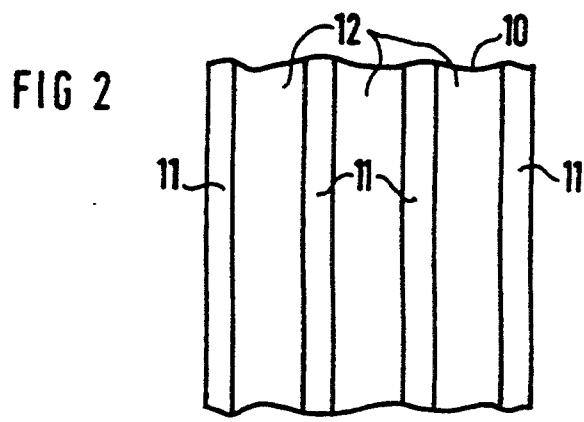
FIGS. 2–4 are fragmentary views of three exemplary embodiments of additional zones shown in FIG. 1.
Figure 3:
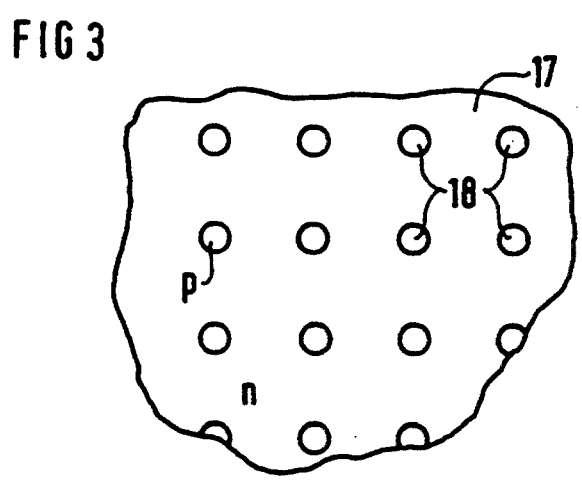
Figure 4:
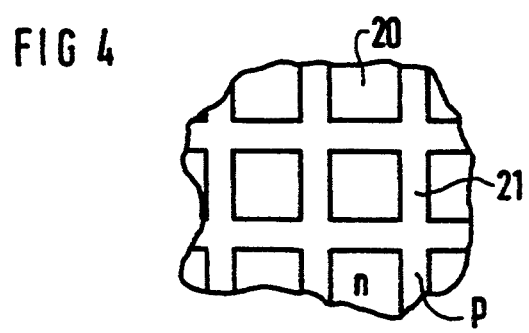

Additional semiconductor zones 11, 12 are disposed in the inner zone 1, in a region of a space charge zone that develops upon blocking voltage. At least two of the zones 11 of the conduction type opposite that of the inner zone 1 are provided. The additional zones 12, which are doped more highly than the inner zone and have the same conduction type (n) as the inner zone 1, are provided between the zones 11. The zones 11, 12 may be flat in form as is shown in FIG. 2. The additional zones of the opposite conduction type may also be rod-like in form, as is shown by zones 18 in FIG. 3. In that case they are surrounded on all sides by a single zone 17. This zone 17, like the zones 12, has the same conduction type as the inner zone but higher doping. The p-doped zones may also form a three-dimensional grid 21, as is shown in FIG. 4. An n-doped zone is identified by reference numeral 20. The conductivity types of the MOSFET may also be inverted.

If a voltage in the conducting-state direction is present at the power FET of FIG. 1, then the power FET can be made conducting through the gate electrode 8. The electrons originating from the source zone 4 then find high doping in the additional zones. This lowers the track resistance of the power MOSFET.

If blocking voltage is applied to the power MOSFET, then a space charge zone develops between the inner zone 1 and the base zone 3, beginning at the p-n junction. Its size increases as the blocking voltage rises. If the space charge zone meets the p-doped zones 11, then they are connected with high impedance to the base zones 3, through the depleted region of the inner zone 1. If the blocking voltage rises further, then the space charge zone expands even more, so that some of the charge carriers are depleted from the zones 11 and 12 as well. This is diagrammatically indicated by dashed lines 13. Upon a further rise in the blocking voltage, the charge carriers are then depleted from a large portion of the inner zone 1 and completely from the zones 11, 12. The space charge zone then takes a course in the inner zone 1 that is defined by a dashed line 14. At a maximum applied blocking voltage, the additional zones are located entirely within the space charge zone. They must be depleted before the breakdown occurs.

The effect of the clearing of the charge carriers is as if the zones 11 and 12 were not present. Given a maximum expansion of the space charge zone, the doping of the inner zone 1 is accordingly solely definitive in a first approximation. If that doping is chosen to be low enough, such as $5 \times 10^{13}$ cm$^{-3}$, then with this component, it is readily possible to block 1000 V and more. Conversely, in the conducting-state instance, the power MOSFET according to the invention has a resistance that is equivalent to that of a substantially lower-blocking MOSFET.

The track resistance can be adjusted by means of the distance a between the zones 11, 12 and the first surface 2. It can also be varied by means of the doping of the zones 12. However, the doping and the thickness of the zones 11, 12 should be adjusted in such a way that the charge carriers are completely depleted from these zones if the maximum blocking voltage is applied.

Instead of connecting the additional zones 11 to the base zones 3 through the space charge zone, the additional zones may also be connected directly with low impedance to the base zones. This is symbolized in FIG. 1 by a connecting line 15. The direct connection has the effect of causing clearing of the charge carriers to begin even before the space charge zone has reached the zones 11, 12.

The additional zones can be produced, for instance, beginning at the drain zone 7 (n+ substrate), by epitaxially depositing the inner zone first up to the intended upper edge of the additional zones 11, 12. Then, by using the trench technique which is known from memory technology, for instance, first trenches are etched into the epitaxial layer with a depth that is equivalent to the vertical dimension of the additional zones. Then, epitaxially p-doped material is deposited in the trenches until they are filled. Through the use of a second etching of trenches and epitaxial deposition, the n-doped zones 12 can then be produced in the same way. After that, weakly n-doped material is epitaxially deposited until the intended thickness of the semiconductor body is attained. The production of the zones 3 and 4 as well as the oxide zones, electrodes, and so forth, is part of the prior art.

FIG. 5 shows a fragmentary view of a lateral MOSFET. Once again, the inner zone is marked by reference numeral 1, the base zone is marked by reference numeral 3, the source zone is marked by reference numeral 4, and the gate electrode is marked by reference numeral 8. These zones are again embedded in the first surface 2 of the semiconductor body. A weakly n-doped tub 22 is embedded in the same surface 2, while the inner zone 1 is weakly p-doped. The tub 22 includes a strongly n-doped drain zone 24 and a drift segment 23. This drift segment begins below the gate electrode 8 and extends as far as the drain zone 24. The use of a drift zone is known from German Published, Non-Prosecuted Application DE 28 52 621. It serves to increase the laterally oriented breakdown field intensity. At least two additional zones 26 of the conduction type opposite that of the tub 22 are disposed in the tub 22. Disposed between the additional zones 26 are additional zones 27 of the same conduction type as the tub 22 but with higher doping, as is shown in the plan view of FIG. 6. In this case the additional zones are in disk form and are disposed parallel to the shortest connection between the base zone 3 and the drain zone 24. However, the zones 26, 27 may also be disposed parallel to the surface 2, or in other words laminated horizontally.

A further embodiment of the additional zones is shown in FIG. 7. The n-doped zones 27 are not disk-like in the embodiment illustrated in this case., Instead, their thickness increases toward the drain zone 24. The intent of this provision is to provide an increasing number of dopant atoms in the direction toward the drain zone. This makes it possible to achieve a further increase in the breakdown field intensity (compare German Published, Non-Prosecuted Application DE 28 52 621).

In the case of the lateral FET of FIG. 5 as well, additional zones with a form other than disk-like may be used. It is again conceivable to use rod-shaped p-doped zones which are surrounded completely or entirely by the n-doped zone 27.

I claim:

1. A power MOSFET, comprising a semiconductor body having:
   first and second surfaces;
   an inner zone of a first conduction type and a given dopant concentration;
   at least one base zone of a second conduction type being adjacent said inner zone and said first surface;
   at least one source zone being embedded in said at least one base zone;
   at least one drain zone adjacent one of said surfaces;
   additional zones of the second conduction type being disposed in said inner zone inside a space charge zone developing when a blocking voltage is present; and
   at least one additional zone of the first conduction type being disposed between said additional zones of the second conduction type and being doped higher than said inner zone;
   said additional zones having a dopant level and said additional zones of the second conduction type being mutually spaced apart, for depleting charge carriers when a blocking voltage is applied.

2. The power MOSFET according to claim 1, wherein said at least one base zone and said drain zone are spaced apart by a shortest connecting line, and said additional zones have a flat shape and are disposed parallel to said shortest connecting line.

3. The power MOSFET according to claim 1, wherein said at least one base zone and said drain zone are spaced apart by a shortest connecting line, and said additional zones have a rod-like shape and are disposed parallel to said shortest connecting line.

4. The power MOSFET according to claim 3, wherein said drain zone adjoins said second surface, and said additional zones are disposed perpendicular to said surface.

5. The power MOSFET according to claim 3, wherein said drain zone adjoins said second surface, and said additional zones are disposed perpendicular to said surface.

6. The power MOSFET according to claim 2, wherein said drain zone and said additional zones are adjacent said first surface and are disposed parallel to said surface.

7. The power MOSFET according to claim 3, wherein said drain zone and said additional zones are adjacent said first surface and are disposed parallel to said surface.

8. The power MOSFET according to claim 1, wherein said additional zones of the second conductivity type are electrically connected to said at least one base zone.

9. The power MOSFET according to claim 1, wherein said at least one base zone is a plurality of base zones, and said at least one source zone is a plurality of source zones each being embedded in a respective one of said base zones.

* * * * *